United States Patent [19]
Meyer et al.

[11] Patent Number: 5,804,475
[45] Date of Patent: Sep. 8, 1998

[54] METHOD OF FORMING AN INTERBAND LATERAL RESONANT TUNNELING TRANSISTOR

[75] Inventors: Jerry R. Meyer, Catonville; Craig A. Hoffman, Columbia; Filbert J. Bartoli, Jr., Upper Marlboro, all of Md.

[73] Assignee: The United States of America as represented by the Secretary of the Navy, Washington, D.C.

[21] Appl. No.: 665,931

[22] Filed: Jun. 19, 1996

Related U.S. Application Data

[62] Division of Ser. No. 338,842, Nov. 14, 1994, Pat. No. 5,654,558, and Ser. No. 379,833, Jan. 27, 1995, Pat. No. 5,665,618.

[51] Int. Cl.$^6$ .............................. H01L 21/20; H01L 21/28
[52] U.S. Cl. ......................... 438/172; 438/573; 438/962
[58] Field of Search .................................. 438/172, 573, 438/962; 257/23, 24, 25, 188, 172

[56] References Cited

U.S. PATENT DOCUMENTS

| | | | |
|---|---|---|---|
| 4,783,427 | 11/1988 | Reed et al. | 437/90 |
| 4,889,831 | 12/1989 | Ishii et al. | 437/184 |
| 5,021,841 | 6/1991 | Leburton et al. | 357/22 |
| 5,093,699 | 3/1992 | Weichold et al. | 357/22 |
| 5,113,231 | 5/1992 | Soderstrom et al. | 257/16 |
| 5,144,378 | 9/1992 | Hikosaka | 357/22 |
| 5,179,037 | 1/1993 | Seabaugh | 437/59 |
| 5,192,698 | 3/1993 | Schuermeyer et al. | 437/40 |
| 5,194,983 | 3/1993 | Voisin | 359/245 |
| 5,199,917 | 4/1993 | MacDonald et al. | 445/24 |
| 5,221,849 | 6/1993 | Goronkin et al. | 257/20 |
| 5,234,848 | 8/1993 | Seabaugh | 437/40 |
| 5,241,190 | 8/1993 | Eisenstein et al. | 257/24 |
| 5,270,225 | 12/1993 | Goronkin et al. | 437/31 |
| 5,326,985 | 7/1994 | Goronkin et al. | 257/22 |
| 5,429,963 | 7/1995 | Martinez et al. | 437/40 |
| 5,449,922 | 9/1995 | Shen et al. | 257/25 |
| 5,453,631 | 9/1995 | Onada et al. | 257/192 |
| 5,504,347 | 4/1996 | Jovanovic et al. | 257/25 |
| 5,529,952 | 6/1996 | Smith et al. | 438/172 |

OTHER PUBLICATIONS

Hoffman et al., Setback Modulation Doping of Hg Te–Cd Te Multiple Quantum Wells, Appl. Phys. Ltrs. 60(18), pp. 2282–2284, May 1992.

Hoffman et al., Electron Mobilities and Quantum Hall Effect in Modulation–Doped Hg Te–Cd Te Superlattices, Phys. Rev. B., vol. 44, No. 15, pp. 8376–8379, Oct. 1991.

Longenbach et al., Resonant Interband Tunneling In InAs/Gd Sb/AlSb/In As and GdSb/InAs/AlSb/GdSb Htererostructures, Appl. Phys. Ltrs, 57(15), pp. 1554–1556, Oct. 1990.

Randall et al, Nanoelectronics: Fanciful Physics or Real Devices, J. Voc. Sc. Technol. B–7(6), pp. 1398–1404, Nov./Dec. 1989.

Ismail et al., Lateral Resonant Tunneling in a Double–Barrier Field Effect Transistor, Appl. Phys. Ltr. 5555(6), pp. 589–591, Aug. 1989.

Chou et al., Observation of Electron Resonant Tunning in a Lateral Dual–Gate Resonant Tunneling Field–Effect Transistor, Appl. Phys. Ltr. 55(2), pp. 176–178, Jul. 1989.

(List continued on next page.)

*Primary Examiner*—John Niebling
*Assistant Examiner*—Thomas G. Bilodeau
*Attorney, Agent, or Firm*—Thomas E. McDonnell; Charles J. Stockstill

[57] ABSTRACT

This invention describes a nanometer scale interband lateral resonant tunneling transistor, and the method for producing the same, with lateral geometry, good fanout properties and suitable for incorporation into large-scale integrated circuits. The transistor is of a single gate design and operation is based on resonant tunneling processes in narrow-gap nanostructures which are highly responsive to quantum phenomena. Such quantum-effect devices can have very high density, operate at much higher temperatures and are capable of driving other devices.

7 Claims, 6 Drawing Sheets

OTHER PUBLICATIONS

Sen et al., Resonant Tunneling Device with Multiple Negative Differential Resistance: Digital and Sianal Processing Applicatins with Reduced Circuit Complexity, IEEE Trans. on Elec. Dev., vol. ED–34, No. 10, pp. 2185–2191, Oct. 1987.

Zaslavsky et al., Resonant Tunneling of Two–Dimensional Electrons into One–Dimensional Subbands of Quanum Wire, Appl. Phys. Ltr. 58(13), pp. 1440–1442, Apr. 1991.

Reed et al., Observation of Discrete States in a Zero–Dimensional Semiconductor Nanostructure, Phys. Rev. Ltrs, vol. 60, No. 6, pp. 535–537, Feb. 1988.

Chou et al., Lateral Resonant Tunneling Field–Effect Transistor, Appl. Phys. Ltr. 52(23), 1982–1984, Jun. 1988.

Blaikie et al., Lateral Resonant Tunneling Through Constrictions in a $\epsilon$–Doped Ga As Layer, Appl. Phys. Ltr. 64(1), pp. 118–120, Jan. 1994.

Chang et al., A Laterally Tunable Quanum Dot Transistor, J Appl. Phys. 76(5), pp. 3209–3211, Sep. 1994.

Seabaugh et al., Quantum Functional Devices: Present Status and Future Prospects, Fut. Elect. Dev. J., vol. 2, No. 3, pp. 1–XII, 1992.

Wolf et al., Silicon Processing for the VLSI Era, Lattice Press, Sunset Beach, CA, p. 493, 1986.

Soderstrom et al., Demonstration of Large Peak–To–Valley Current Ratios In InAs/AlGaSb/InAs Single–Barrier Heterostructures, Appl. Phys., Ltrs., 55(13), pp. 1348–1350, Sep. 1989.

Cross-section A-A

Cross-section B-B

METHOD OF FORMING AN INTERBAND LATERAL RESONANT TUNNELING TRANSISTOR

This is a divisional of application Ser. No. 08/338,842, filed Nov. 14, 1994, now U.S. Pat. No. 5,654,558, and Ser. No. 08/379,833 filed Jan. 27, 1995, now U.S. Pat. No. 5,665,618.

BACKGROUND OF THE INVENTION

1. Field of the Invention

This invention pertains to a tunneling transistor and in particular to an interband lateral resonant tunneling transistor.

2. Description of Related Art

Conventional semiconductor technologies are rapidly approaching practical limits to minimum device sizes which can be achieved in very large scale integrated (VLSI) circuits. It is estimated that the limit of the minimum active-region dimension, L (gate length, channel length, etc.), of such devices are on the order of 1000 Å for both bipolar and field effect transistor (FET) devices. Conventional device speeds are similarly limited, since there is a direct correlation between size and speed and the maximum cutoff frequencies achievable are estimated to be in the order of 300 GHz. At the present rate of development, these limits will have been reached by around the turn of the century.

In order to achieve the ultimate limits in downscaling, Randall et al. in the paper *Nanoelectronics: Fanciful physics or real devices?*, J. Vac. Sci. Technol., B7(6), pp. 1398–1404, Nov/Dec 1989, discussed heterojunction technology employed to form tunneling barriers and quantum wells. The tunnel barrier is a thin slab of wide band gap material clad by a narrow band gap material. When the layer is physically thin enough, (comparable to the electron wavelengths) quantum mechanical tunneling through the barrier is permitted. The quantum well is complementary to the tunnel barrier. It is a slab of sufficiently thin narrow band gap material surrounded by a wide band gap material. Electrons confined to this layer will have quantized energy levels where the ground state energy is higher than the conduction band edge found in a bulk crystal.

A transistor utilizing resonant tunneling (RT) diode technology, where tunnel barriers and quantum wells are combined to form a quantum effect device, has been proposed as one means to overcome the problems foreseen in VLSI technology. This proposal is based upon the extremely high speed associated with tunneling phenomena, and in part on the small minimum intrinsic length which is required (present vertical diodes are often less than 100 Å thick). It is advantageous to reduce both the. longitudinal and lateral dimensions of an RT diode or transistor, because this sharpens the quantum resonances.

The resonant tunneling (RT) diode technology has been around for the past two decades and one popular approach is to put a double-barrier quantum well structure inside a bipolar transistor or in series with a modulation-doped field-effect transistor (MODFET) having a single gate structure. Nearly all resonant tunneling transistor devices reported to date have employed vertical geometry.

Another approach is shown in FIG. 1 where the lateral resonant tunneling field-effect transistor (LARTFET) 10, which is very similar to the MODFET, except that it has dual closely spaced nanometer gates 12 and 14. The dual gates, or electrodes, 12, 14 electrostatically create double potential barriers in the channel and a quantum well 16 in between. By controlling the potential on the gates, 12 and 14, the barrier heights, 18 and 22, can be adjusted continuously. This technology is set forth in the paper by Chou et al., *Observation of electron resonant tunneling in a lateral dual-gate resonant tunneling field-effect transistor,* Appl. Phys. Lett. 55 (2), pp. 176–178, July 1989. A similar technology having two or three closely separated, independently controlled gate fingers, termed a planar resonant tunneling field-effect transistor (PRESTFET), has been reported by Ismail et al. in the paper entitled *Lateral Resonant tunneling in a double-barrier field-effect transistor,* Appl. Phys. Lett. 55(6), pp. 589–591, August 1989. In the devices reported by both Chou et al. and Ismail et al., potentials applied to the dual gates (separated from the GaAs channel by an $Al_xGa_{1-x}$ layer) induce barriers that quantize the electron states in the central region. In both papers, the quantum well width, $L_W$ and gate length, $L_G$, are in the 600–1000 Å range. Also see, U.S. Pat. No. 5,241,190, Eisenstein et al. which describes a resonant tunneling transistor having a plurality of gates disposed on opposing sides of the transistor structure.

Therefore, while lateral structures have considerable architectural advantages in ultra-dense circuits, the lateral tunneling transistors presently available to the art have displayed negative differential resistance only at extremely low temperatures (4.2K). Most of these have displayed either low transconductance or low impedance, which accounts in part for the fact that demonstrated circuits have generally employed no more than a single transistor.

This is because the transconductance, $g_m$, is far too small to be useful in driving other devices. Although vertical RT devices can in principle be reduced to a size much smaller than the 1000 Å limit for conventional transistors, fabrication becomes increasingly difficult because of the need to individually contact the three different vertical layers.

It is well known that semiconductors with small energy gaps have small effective masses as well, and hence far greater response to quantum phenomena than do wide gap semiconductors confined to the same scale length. Quantum-effect devices will therefore operate at much higher temperatures, and processes which are too weak to be useful in wide-gap configurations become practical when a narrow-gap nanostructure is employed. Also, depletion of the carrier population becomes a serious limitation in wide-gap nanostructure devices with the shrinking of the device size due to the pinning of the Fermi level by mid-gap states.

Quantum wells produce confinement in one dimension only. When one lateral dimension is reduced a quantum wire is obtained. When both lateral dimensions are reduced to the order of the electron wavelength, the bands are split into discrete electron states and one obtains a "quantum dot."

SUMMARY OF THE INVENTION

It is the objective of this invention to provide a resonant tunneling device based on resonant tunneling processes in narrow-gap nanostructures capable of driving follow-on devices within the electronic circuit.

Another object of this invention is to provide a resonant tunneling transistor displaying negative differential resistance (NDR) and transconductance, $g_m$, that are favorable to fanout ($\neq 10^4$ mS/mm) at temperatures, T, up to 300K.

These objects are achieved by an interband lateral resonant transistor that is a narrow-gap heterostructure transistor employing the resonant tunneling technique with a single gate. Tunneling occurs via valence states in the gate region which have been brought into energy resonance with the conduction states in the source and drain channels. In the design of the interband lateral resonant transistor advantage is taken of the fact that the valence quantum states, or levels, are well resolved because the subband splitting for holes near the top of the valence band in both Hg-based and InAs-based quantum wells are nearly as large as for the electrons.

The electronic material forming the transistor is AlSb-InAs-GaAlSb or a modulation-doped HgTe—CdTe single quantum well grown by molecular-beam epitaxy. The pattern of the interband lateral resonant transistor is defined in a resist by electron-beam lithography and transferred to electronic material by reactive ion or wet chemical etching.

DESCRIPTION OF THE PREFERRED EMBODIMENT

In utilizing narrow-gap semiconductors in quantum-effect devices, it is apparent from the particle-in-a box approximation $$E_n \approx \frac{n^2 \pi^2 \hbar^2}{2m^* L_W^2} \tag{1}$$

that the subband splitting, $\Delta E = E_{n+1} - E_{n1}$ for a quantum well width, $L_W$, scales inversely with effective mass, $m^*$, where $E_n$ is the energy level for a given quantum state ($n^{th}$ subband), and h is the Planck's constant. Since $m^*$ is approximately proportional to the energy gap, $E_g$, quantum effects are far stronger in narrow-gap semiconductors.

Figure 1:
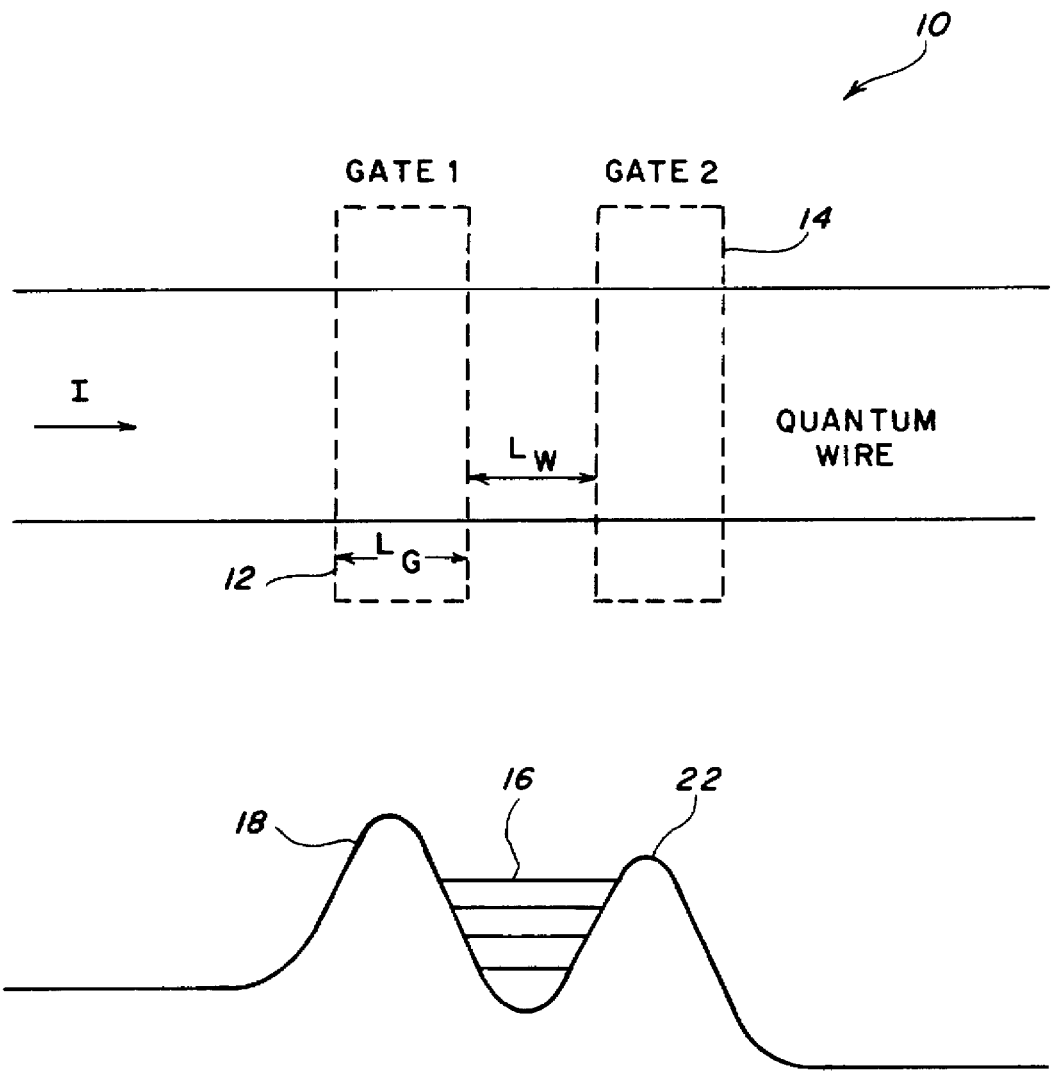
FIG. 1 is a depiction of the prior art utilizing multiple gates and lateral geometry.
Figure 2A:
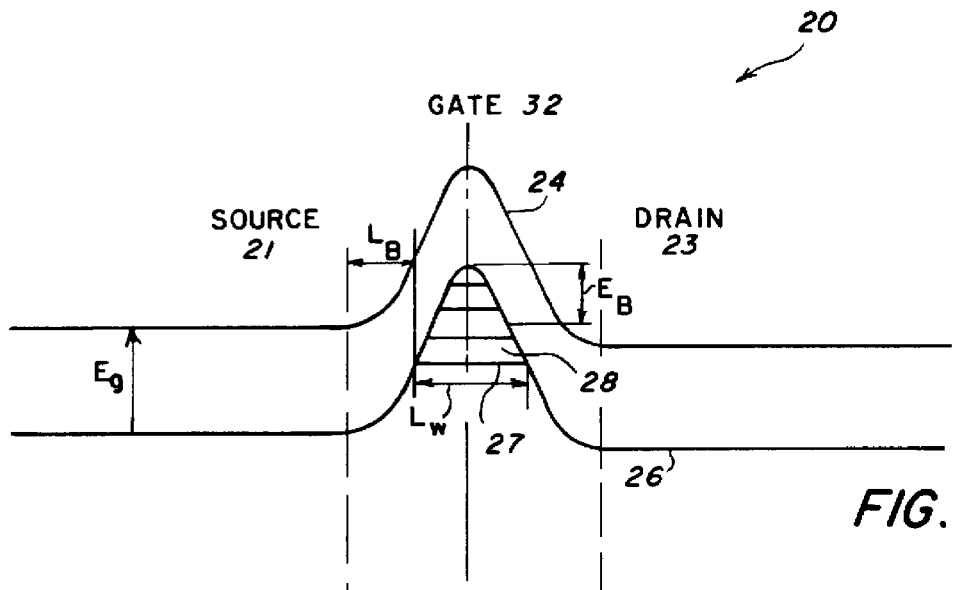
FIG. 2a is a schematic of the lateral profile for the conduction band and valence band within the interband lateral resonant transistor.

Referring to FIG. 2a, the separation between the energy of the conduction band 24 and the valence band 26 is called the band or energy gap, $E_g$, and energy regions or energy bands are permitted above and below this energy gap, $E_g$. Thus the predicted subband levels for a narrow-gap quantum wire 31 and quantum dot 28 are exceptionally well-resolved, with subband separations potentially exceeding the thermal energy, $k_B T$, at 300K. Therefore, quantum-effect devices utilizing the narrow-gap nanostructure will display much sharper tunneling resonances and operate at higher temperatures. A HgTe—CdTe quantum well structure 20 with a quantum well length, $L_W$, (approximately 500 Å) will yield $\Delta E > 100$ meV, i.e., much greater than the thermal energy, $k_b T$, at 300K (26 meV). By employing a material with a smaller effective mass, the transmission coefficient, $T\alpha$, through a barrier 27

$$T\alpha \, e^{-L_B (8m^* \frac{E_B}{\hbar^2})^{\frac{1}{2}}} \tag{2}$$

is also improved. $L_B$ is the thickness of the barrier 27 and $E_B$ is its height.

Figure 2B:
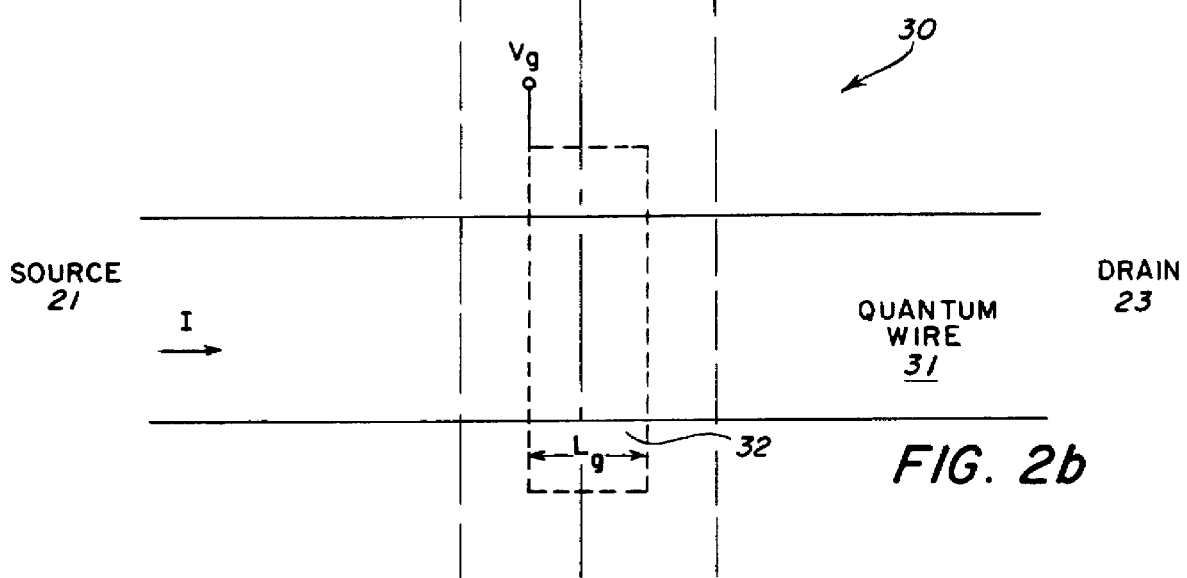
FIG. 2b is a schematic of an interband lateral resonant transistor depicting the placement of a single gate and the lateral geometry.

The bandline, shown in FIG. 2a, is accomplished in the interband lateral resonant tunneling transistor (ILRTT) 30, shown in FIG. 2b, at the points shown by dashed lines from the schematic depiction of FIG. 2a to a corresponding point in the ILRTT shown in FIG. 2b. In application of the theory, the interband lateral resonant transistor, shown in FIG. 2b, employs a single gate, or electrode 32 whose effective barrier thickness is less than the gate width, $L_g$. Tunneling occurs via hole states in the gate 32 region which have been brought into resonance with the conduction band 26 in the source. Resonant interband processes are well-known from Type-II heterostructure tunneling and are the dominant mechanism in vertical InAs—GaSb—AlSb RT diodes. Type-II heterostructures are structures where the conduction band 24 minimum is in one layer (InAs) while the valence band 24 maximum is in the other (preferably AlGaSb). This leads to a spatially-indirect energy gap, $E_g$, which is much smaller than the energy gap, $E_g$, in either of the two constituent materials.

It is desirable that the energy gap, $E_g$, be small (about 50–100 meV) so that the gate voltage, $V_g$, does not have to be raised to a high level (>100 meV) before tunneling from the conduction band 24 to the hole state valence band 26 occurs. If the energy gap, $E_g$, were very large (>300 meV), a larger voltage would have to be applied to the gate 32 before tunneling would occur.

The pattern for the quantum wire source 21 and drain 23 for the gate 32 of transistor 30 may be defined in a resist by electron-beam lithography and transferred to the electronic material by reactive ion etching, or with negatively-biased gates. The resist is normally left to the discretion of the individual for pattern definition in the semiconductor.

The preferred resists have yielded resolutions of 400 Å for SAL-601 and 250 Å for PMMA. Dry etching could be accomplished using an electron cyclotron resonance (ECR) microwave plasma source for the reactive ion etching system, such as that manufactured by Applied Science and Technology of Woburn, Mass. The heterostructure is etched through exposure of the substrate to an ECR-generated $CH_4/H_2$ plasma. The ECR provides low ($\approx 20$ eV) and controllable ion energies which yield minimal damage levels to the exposed semiconductor sidewalls. Using the SAL-601 mask for e-beam lithography and ECR/RIE processing, Hg-based nanostructures with nearly vertical sidewalls are achievable. Following etch definition of the narrow-gap nanostructures, surfaces are passivated with an insulator (such as $Si_3N_4$ or $SiO_2$), e.g., using a plasma deposition process well known to the art. The metal gates may be patterned with PMMA on top of the insulator layer.

Figure 2C:
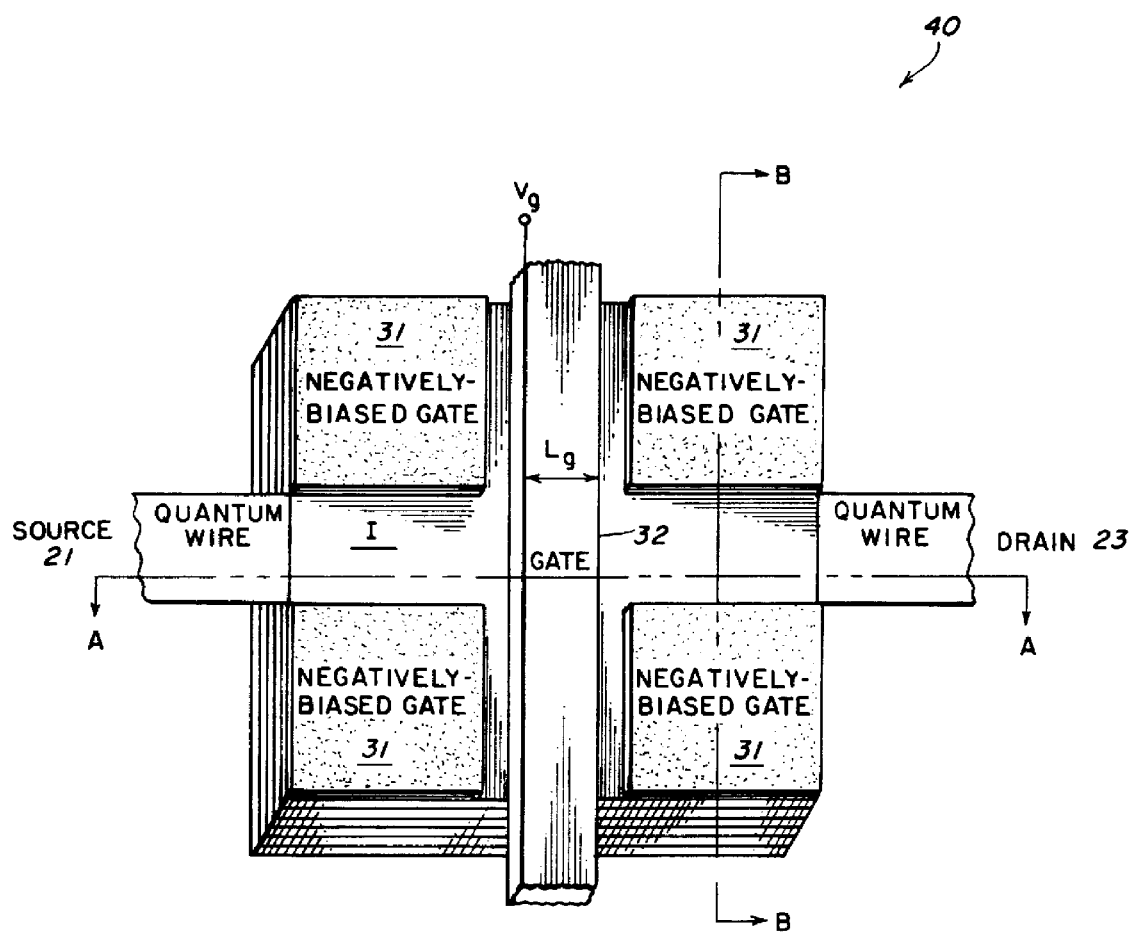
FIG. 2c is a schematic of an one-gate interband lateral resonant transistor utilizing negatively-biased gates.

When the pattern for the quantum wire source 21 and drain 23 for the transistor 40, FIG. 2c, is defined utilizing negatively-biased gates 31, those negatively-biased gates 31 must be physically separated from the gate 32, described above, which controls the resonant tunneling or by etching.

Figure 3A:
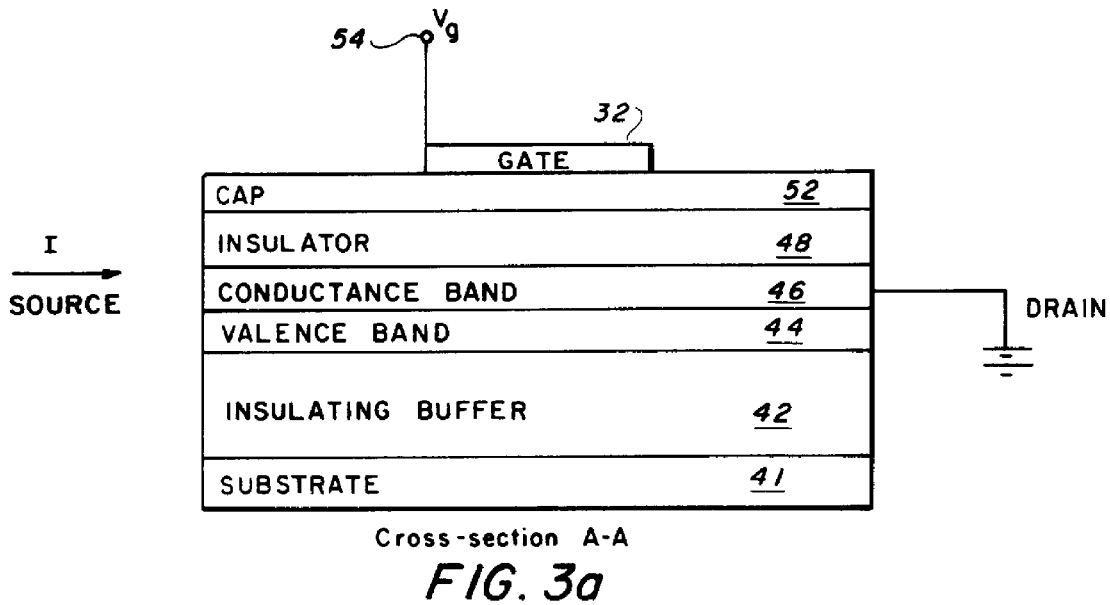
FIG. 3a is a preferred embodiment schematic of the design of the quantum well structure of an interband lateral resonant tunneling transistor along cross-section A—A of FIG. 2c.

A preferred quantum well structure 50, FIG. 3a, is grown on a substrate 41 using molecular-beam epitaxy (MBE). The substrate 41 can be of any insulating material normally utilized for that purpose, such as gallium arsenide (GaAs). MBE is the preferred method for growing the quantum well structure on the substrate 41 because it is well known in the art that MBE produces atomically smooth layers and allows very precise control over grown layer thickness.

Utilizing MBE a nonconducting buffer layer 42 of aluminum antimonide (AlSb) approximately one to two micrometers thick is grown onto the substrate 41 material to ease the mismatch of the lattice constants between the substrate material 41 and the succeeding layers of materials 42, 44, 46 and 48, described below.

A layer 44 of aluminum-gallium-antimonide ($Al_xGa_{1-x}Sb$) having a thickness of approximately 50–100 Å, preferably 80 Å, is deposited upon the buffer 42 utilizing MBE. This layer 44 of AlGaSb contains the hole state involved in the resonant tunneling.

An indium-arsenide (InAs) layer 46 is then deposited on the layer 44 of AlGaSb to a thickness of approximately 100–150 Å, 150 Å being preferable. The InAs layer 46 contains the electrons and provides conduction in the source and drain. Electrons in the InAs, upon entering the area under the gate tunnel into the AlGaSb, and then tunnel back into the InAs upon exiting the gate region.

By varying the alloy concentration, x, from 0.2 to 0.4 in the $Al_xGa_{1-x}Sb$ layer 44, the energy gap, $E_g$, may be varied from approximately −50 meV up to 400 meV. The optimum being from approximately 50–100 meV which will occur when using an AlGaSb layer 44 preferably composed of approximately 40% aluminum and 60% gallium. Electron energy is conventionally defined to be positive when measured upward, and the hole energy is positive when measured downward.

Following the layer 46 of InAs, an insulating layer 48 of aluminum-antimonide (AlSb) from approximately 250–500 Å thick, 250 Å being preferable, is deposited utilizing MBE. The AlSb layer 48 makes the input impedance of the ILRTT essentially infinite.

To prevent oxidation of the AlSb 48, a cap layer of gallium-antimonide (GaSb) 52 is deposited on the AlSb layer 48 because of the non-oxidizing nature of the material and the good lattice match with the underlying AlSb.

A metal gate (or electrode) 32, preferably chrome-gold, is deposited onto the GaSb cap layer 52 by a standard processing technique, such as thermal e-beam sputtering, and then defined by electron (e)—beam lithography. The gate 32 has a lithographic gate thickness, $L_g$, of approximately 500–1000 Å, preferably 500 Å, a length slightly longer than the source/drain width, $L_S$, which is ideally no more than 1000 Å wide (these dimensions may vary, such that the width, $L_S$, may be 500 Å, or smaller).

A voltage, $V_g$, is laterally applied to the metal gate 32 at the connection point 54 and may vary from approximately zero to three volts. The gate voltage, $V_g$, raises the conduction and valence levels over a limited lateral extent. The peak current density, $J_p$, is orders of magnitude higher than for a two gate structure of the prior art, depending on the voltage, $V_g$, applied. Theoretical estimates have established $J_p \approx 10^4$ A/cm$^2$ and $g_m \approx 10^4$ mS/mm at 300K, where A is amperage and $g_m$ is transconductance.

Figure 3B:
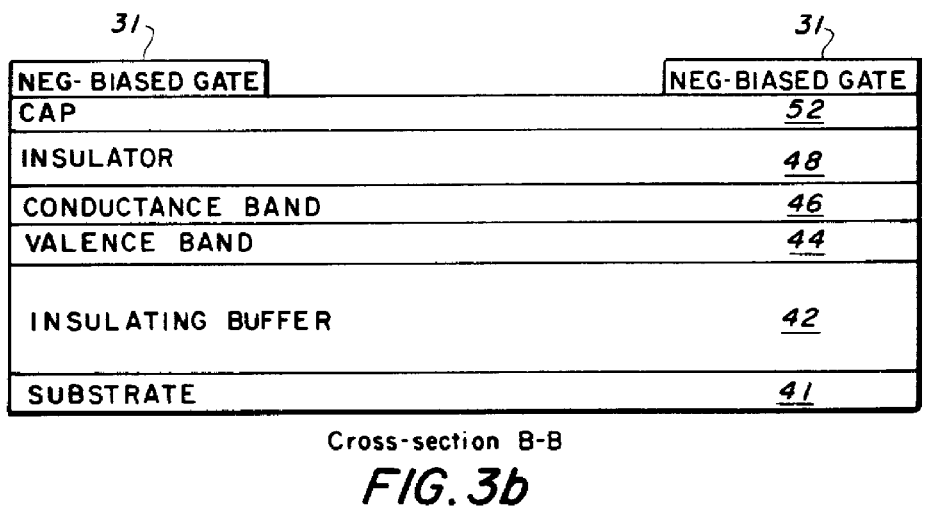
FIG. 3b is a preferred embodiment schematic of the design of the quantum well structure of an interband lateral resonant tunneling transistor along the cross-section B—B of FIG. 2c.

FIG. 3b shows the preferred embodiment of the quantum well structure of an interband lateral resonant tunneling transistor along the cross-section B—B of FIG. 2c.

Figure 4:
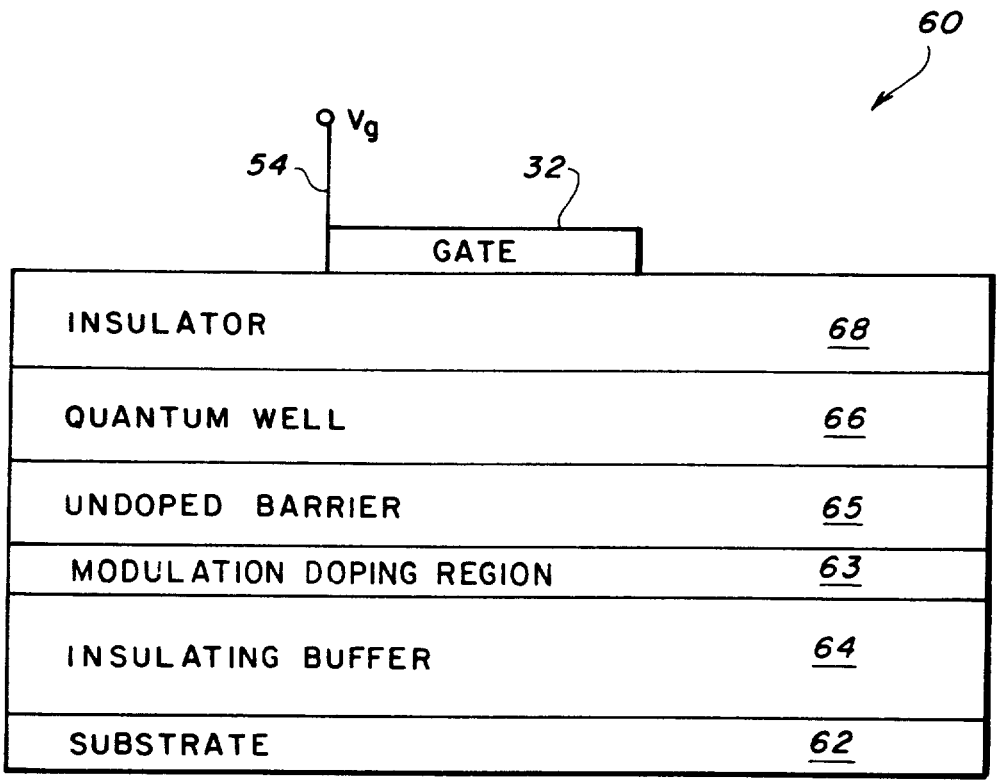
FIG. 4 is another preferred embodiment cross-sectional schematic of the design of the quantum well structure of a resonant tunneling transistor along cross-section B—B of FIG. 2c.

In another preferred quantum well structure, FIG. 4, cadmium-telluride (CdTe) forms the substrate 62 with a buffer layer 64 of CdTe two microns thick deposited on top of the substrate 62 utilizing MBE. An n-type CdTe modulation doping region 63, or doping area, containing indium or gallium dopants, 20–100 Å thick, preferably 50 Å, and containing a sheet density of $10^{11}$–$10^{12}$ cm$^{-2}$ dopants, preferably $2 \times 10^{11}$ cm$^{-2}$, is deposited on the insulating buffer layer 64 by MBE. An undoped CdTe barrier layer 65, or undoped region, 50–1000 Å, preferably 200 Å, is deposited on the doping layer 63 by MBE.

A quantum well layer 66 of mercury-telluride (HgTe) is deposited on the CdTe spacer undoped barrier layer 65 by MBE and contains both the electron states and the hole states involved in the resonant tunneling. This layer 66 may be approximately 40–70 Å thick, preferably 60 Å and forms a single quantum well containing both the conduction band minimum and valence band maximum between which resonant tunneling occurs.

On the HgTe layer 66, a layer 68 of CdTe approximately 250–500 Å, preferably, 250 Å, is deposited by MBE to form an insulator between the HgTe layer 66 and a gate 32. The gate 32 material, size and method of depositing are the same as described above.

The embodiments described above, ideally, are a quantum wire, very narrow, approximately 400 Å, but with a length to be defined by the designer to meet anticipated use. With the use of the sub-micron size elements, the packing density will be very high (over $10^9$ cm$^{-2}$) allowing the inclusion of follow-on devices driven by the RT packaged into a total device size of less than a micron. The power dissipation of the total RT device is the limiting factor for determining packing density.

It is noted that the depletion of the carrier population is avoided in both Hg-based and InAs-based nanostructures of arbitrarily-small size, since the surface states for both systems lie above the conduction band minimum rather than within the energy gap.

Figure 5A:
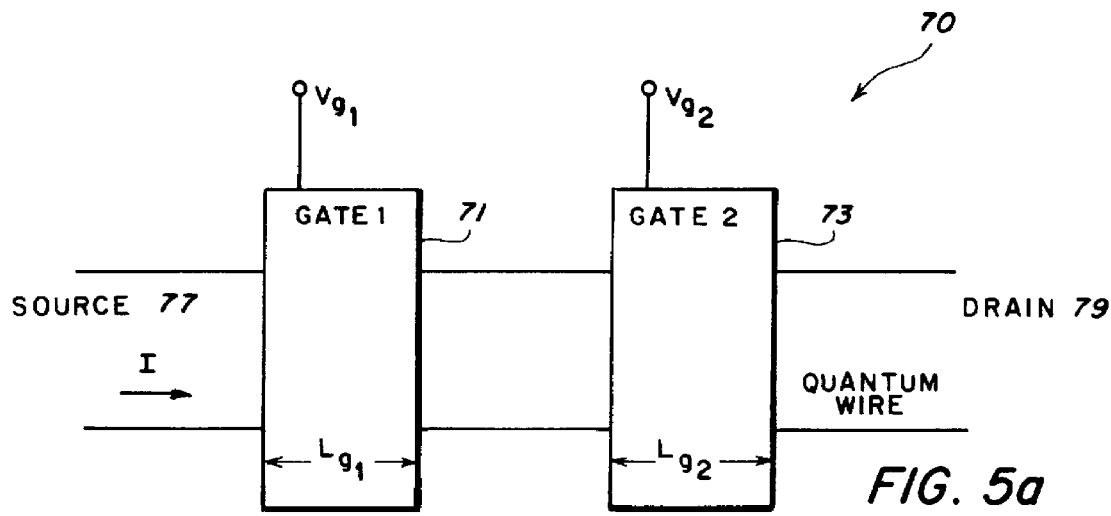
FIG. 5a is a schematic of a two-gate interband lateral resonant tunneling device depicting the placement of the two gates and the lateral geometry.
Figure 5B:
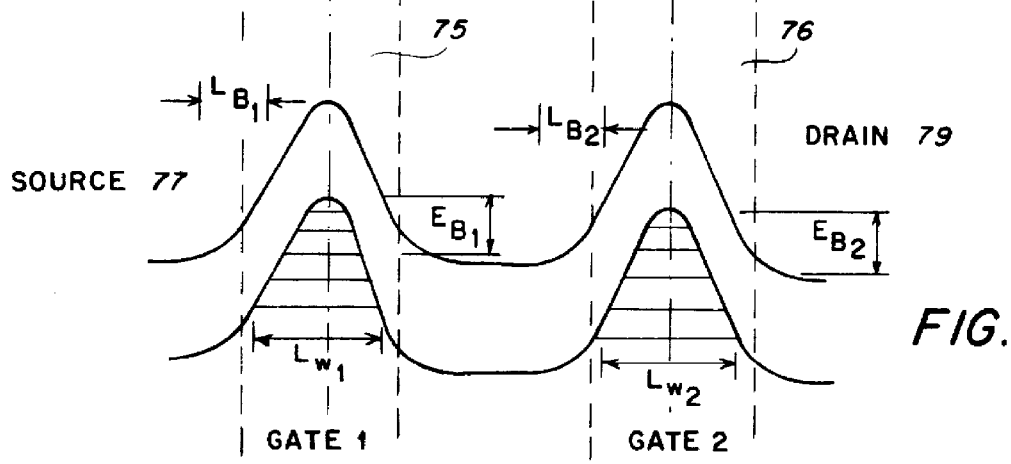
FIG. 5b is a schematic of the lateral profile of the conduction band and valence band within a two-gate interband lateral resonant unneling device.

Although the preferred embodiments set forth a single gate device, multiple-gate ILRTT devices would simulate more complicated logic functions. This feature would enable an integrated circuit to be designed utilizing the techniques set forth above that would decrease the number of transistors required for a given circuit. A multiple, or two-gate ILRTT device 70, shown in FIGS. 5a and 5b, has operating principles similar tho those of the one-gate device 20, shown in FIGS. 2a and 2b, with the exception that the interband tunneling resonance under both gate regions 75 and 76 are independently tuned through the two gate voltages $V_{g_1}$ and $V_{g_2}$. Although the ILRTT structure has been discussed above in terms of laterally-confined AlSb—InAs—GaAlSb or HgTe—CdTe quantum wells, the device could also employ a number of other narrow-gap systems such as InSb, InGaAs, narrow-gap IV–VI semiconductors (PbTe—SnTe, PbSe—SnSe, etc.), Bi-based superlattices (e.g., Bi—CdTe and Bi—PbTe) and Sb-based superlattices (Sb—GaSb—InAs). Also, where the above discussion has considered devices with electron conduction in the source 77 and drain 79 and interband tunneling into hole states under the gates 71 and 72, one may also invert all of the polarities to employ hole conduction in the source 77 and drain 79 and interband tunneling into electron states under the gates 71 and 72.

Integration into silicon devices can be accomplished through MBE or metal-organic chemical vapor deposition (MOCVD) growth onto a buffer layer such as GaAs which is grown onto a silicon substrate. Both narrow-gap III–V and Hg-based II–VI quantum wells can be fabricated in this manner. Further, although it is specified that electron beam lithography combined with reactive ion etching is used to fabricate the ILRTT nanostructure devices, other patterning methods capable of producing features of the required dimensions would be applicable. Possible alternative methods would include wet chemical etching and selective area epitaxy. Also numerous variations on the lithographic and etching chemicals well known to the art are usable.

Not only are ILRTT devices an order of magnitude faster than the maximum speeds for conventional VSLI devices, but the approach set forth in the preferred embodiments is suitable for continued downscaling into the sub-1000 Å regime. As improved lithographic and other nano-fabrication methods succeed in reducing feature sizes beyond those now available, narrow-gap ILRTT's will display improved performance down to L<100 Å.

ILRTT devices present a suitable building block for the design of large-scale integrated circuits. The prior art has not disclosed that NDR is also attractive as the basis for a complementary logic employing resonant tunneling transistors. Fanout is also excellent because of the high input impedance and high conductance, and the low voltage swing will be conducive to high speed. Multi-state RT memories based on multiple NDR minima in a ILRTT will function with far fewer devices. ILRTT is also well suited for highly-parallel neural network logic. Here again the lateral architecture will have significant advantages, and narrow-gap ILRTT's presently offer the only viable opportunity for lateral circuits with high-temperature operation.

Although the invention has been described in relation to exemplary preferred embodiments thereof, it will be understood by those skilled in this art that still other variations and modifications can be affected in these preferred embodiments without detracting from the scope and spirit of the invention.

What is claimed is:

1. A method for making a tunneling transistor consisting of the following steps:

depositing a material forming an insulating buffer layer of material on a substrate to ease a mismatch between said substrate and succeeding layers of material;

depositing a layer of material forming a doping region on the insulating buffer layer;

depositing a layer of material forming an undoped barrier on the doping region;

depositing a material forming a single quantum well layer containing both electron states and the hole states on the undoped barrier;

depositing an insulating layer of material on said single quantum well layer of material; and depositing a single electrode of a width small enough to induce quantized energy subband levels with energy separators greater than the thermal energy kBT, where T is BOOK, due to lateral confinement induced by the electrode, said electrode disposed on said insulating layer forming a gate controlling a flow of electrons so as to cause interband lateral resonant tunneling in said single quantum well layer of material under said electrode when a voltage is applied to said electrode.

2. A method, as in claim 1, wherein the quantum well layer is mercury-telluride (HgTe).

3. A method, as in claim 1, wherein the insulating buffer layer is cadmium-telluride (CdTe).

4. A method, as in claim 1, wherein the doping region is n-type cadmium-telluride (CdTe) containing indium (In) dopants.

5. A method, as in claim 1, wherein the doping region is n-type is cadmium-telluride (CdTe) containing gallium (Ga) dopants.

6. A method, as in claim 1, wherein the undoped barrier is cadmium-telluride (CdTe).

7. A method, as in claim 1, wherein the insulating layer is cadmium-telluride (CdTe).

* * * * *